(12) United States Patent
Liaw

(10) Patent No.: US 11,792,971 B2
(45) Date of Patent: Oct. 17, 2023

(54) FINFET SRAM CELLS WITH DIELECTRIC FINS

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 46 days.

(21) Appl. No.: 17/379,104

(22) Filed: Jul. 19, 2021

(65) Prior Publication Data

US 2021/0343727 A1 Nov. 4, 2021

Related U.S. Application Data

(62) Division of application No. 16/050,702, filed on Jul. 31, 2018, now Pat. No. 11,069,692.

(51) Int. Cl.
*H01L 27/092* (2006.01)
*H10B 10/00* (2023.01)
(Continued)

(52) U.S. Cl.
CPC ......... *H10B 10/12* (2023.02); *H01L 27/0207* (2013.01); *H01L 27/0924* (2013.01); *H01L 29/785* (2013.01)

(58) Field of Classification Search
None
See application file for complete search history.

(56) References Cited

U.S. PATENT DOCUMENTS

| 6,977,837 B2 | 12/2005 | Watanabe et al. |
| 7,812,373 B2 | 10/2010 | Bauer et al. |
| | (Continued) | |

FOREIGN PATENT DOCUMENTS

| TW | 201739036 A | 11/2017 |
| TW | 201806086 A | 2/2018 |

OTHER PUBLICATIONS

Yasuhiro Fukaura et al., "A Highly Manufacturable High Density Embedded SRAM Technology for 90nm CMOS", 2002, pp. 415-418, International Electron Devices Meeting, San Francisco, CA, USA.

*Primary Examiner* — Joseph C. Nicely
*Assistant Examiner* — Lamont B Koo
(74) *Attorney, Agent, or Firm* — HAYNES AND BOONE, LLP

(57) ABSTRACT

An SRAM cell includes: first, second, third, fourth, and fifth dielectric fins disposed in this order along a first direction and oriented lengthwise along a second direction, where the first and the fifth dielectric fins define two edges of the SRAM cell; a first n-type semiconductor fin structure disposed between the first and the second dielectric fins; a second n-type semiconductor fin structure disposed between the fourth and the fifth dielectric fins; a first p-type semiconductor fin structure disposed between the second and the third dielectric fins; a second p-type semiconductor fin structure disposed between the third and the fourth dielectric fins, where each of the first and the second n-type semiconductor fin structures and each of the first and the second p-type semiconductor fin structures is oriented lengthwise along the second direction; and gate structures oriented lengthwise along the first direction, where the gate structures engage with one or more of the dielectric fin.

20 Claims, 13 Drawing Sheets

(51) Int. Cl.
*H01L 27/02* (2006.01)
*H01L 29/78* (2006.01)

(56) References Cited

U.S. PATENT DOCUMENTS

| | | | |
|---|---|---|---|
| 8,621,398 B2 | 12/2013 | Shen et al. |
| 8,772,109 B2 | 7/2014 | Colinge |
| 8,779,528 B2 | 7/2014 | Liaw |
| 8,785,285 B2 | 7/2014 | Tsai et al. |
| 8,796,666 B1 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,830,732 B2 | 9/2014 | Liaw |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,962,400 B2 | 2/2015 | Tsai et al. |
| 8,963,258 B2 | 2/2015 | Yu et al. |
| 8,964,453 B2 | 2/2015 | Lin et al. |
| 8,964,457 B2 | 2/2015 | Liaw |
| 9,093,514 B2 | 7/2015 | Tsai et al. |
| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,245,805 B2 | 1/2016 | Yeh et al. |
| 9,520,482 B1 | 12/2016 | Chang et al. |
| 9,548,303 B2 | 1/2017 | Lee et al. |
| 9,576,814 B2 | 2/2017 | Wu et al. |
| 9,601,497 B1 | 3/2017 | Chen et al. |
| 2009/0017628 A1 | 1/2009 | Kim et al. |
| 2010/0041198 A1 | 2/2010 | Zhu et al. |
| 2013/0094035 A1 | 4/2013 | Chang et al. |
| 2013/0285116 A1 | 10/2013 | Lochtefeld et al. |
| 2017/0069621 A1 | 3/2017 | Huang et al. |
| 2017/0098648 A1 | 4/2017 | Lee et al. |

# FINFET SRAM CELLS WITH DIELECTRIC FINS

CROSS-REFERENCE TO RELATED APPLICATIONS

This is a divisional of U.S. patent application Ser. No. 16/050,702, filed Jul. 31, 2018 and titled "FinFET SRAM Cells with Dielectric Fins," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, in fin-like field effect transistor (FinFET) fabrication processes, it has become challenging to meet the demand for increased fin density and decreased fin geometry while providing high circuit performance in devices such as static random access memory (SRAM) cells. In many instances, reduction in fin geometry may lead to a host of issues such as increased source/drain (S/D) contact resistance and coupling capacitance that adversely impact many aspects of the device performance in SRAM cells. Accordingly, improvements in these areas of FinFET fabrication are desirable.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
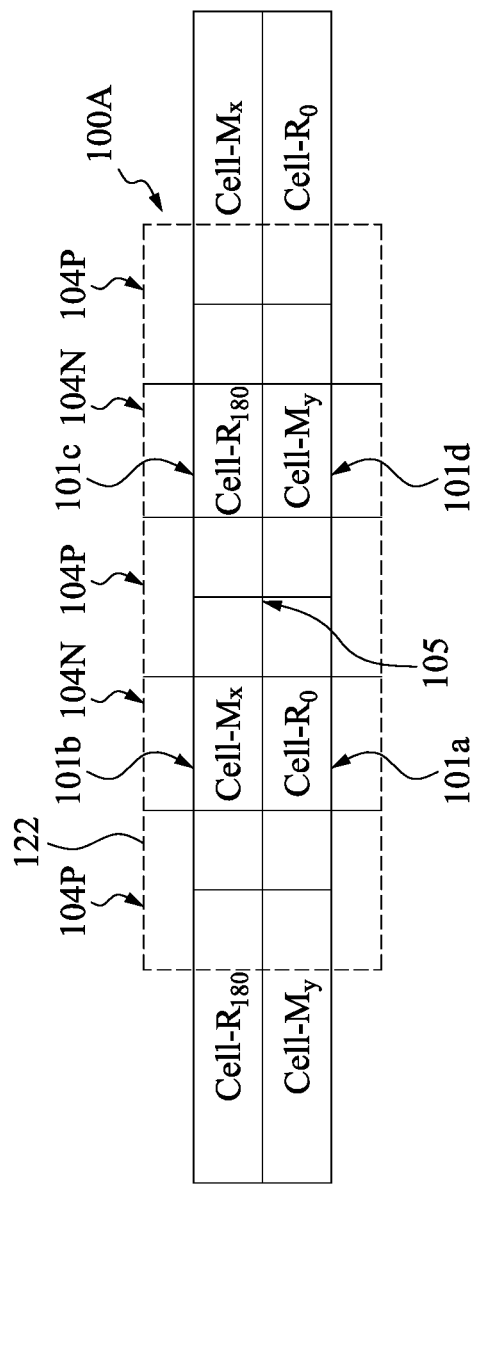
FIG. 1 is a schematic illustration of a layout of a semiconductor device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and methods of forming the same. More particularly, the present disclosure is related to fin isolation structures.

As the demand for increased device density continues to grow, many challenges are present in meeting such demand while maintaining desired device performance. For example, higher device density and integration means that more FinFETs (hence, more fins) are present per unit wafer area. This leads to narrow fin-to-fin spacing between adjacent FinFETs. The narrow fin-to-fin spacing limits the growth of adjacent S/D epitaxial features in order to prevent accidental shorting of the S/D features. When S/D epitaxial features become smaller, there is less landing area for S/D contacts, leading to increased S/D contact resistance. The
} present disclosure provides FinFET SRAM structures, and methods of forming the same, that include dielectric fins (alternatively referred to as dummy fins) disposed between adjacent semiconductor fins to at least increase the space available for the growth of S/D features, which could lead to increased landing area for S/D contacts.

The various accompanying figures (FIGS. 1-11) show top and cross-sectional views of a portion of a semiconductor device in various embodiments (e.g., 100A, 100B, and 100C), according to aspects of the present disclosure. The device (or structure) 100 is provided for illustration purposes and does not necessarily limit the embodiments of the present disclosure to any number of transistors, any number of regions, or any configuration of structures or regions. Furthermore, the devices 100A, 100B, and 100C may each be an IC, or a portion thereof, that may comprise static random access memory (SRAM) and/or standard logic circuits, passive components such as resistors, capacitors, and inductors, and active components such as p-type field effect transistors (PFETs), n-type FETs (NFETs), multi-gate FETs such as FinFETs and gate all-around (GAA) FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof. In many embodiments as depicted herein, each of the devices 100A, 100B, and 100C is a portion of an SRAM cell.

Figure 2:
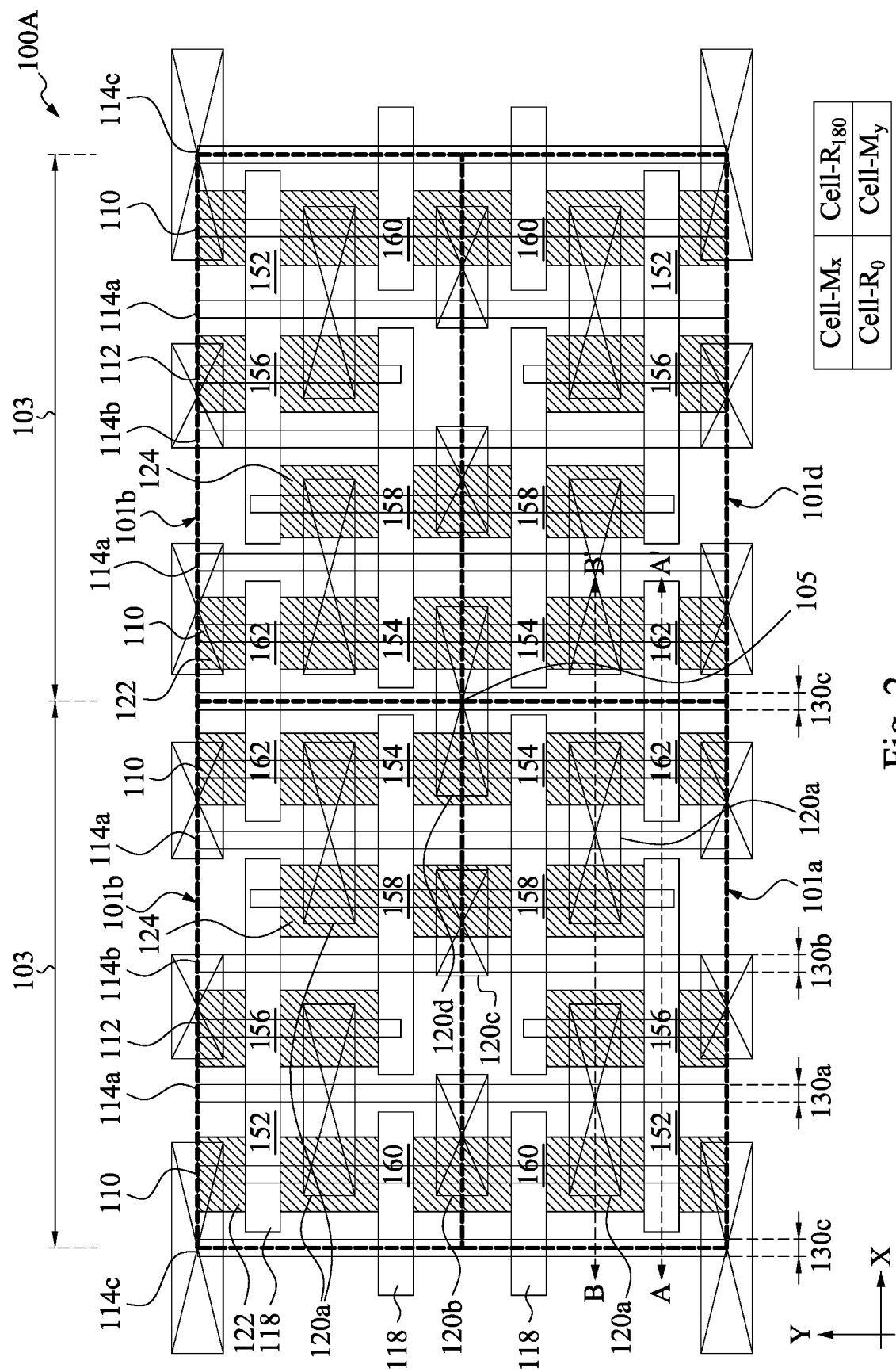
FIG. 2 is a top view of a portion of the semiconductor device of FIG. 1, according to some embodiments of the present disclosure.

FIG. 1 is a schematic representation of a layout of the device 100A that includes multiple cells (or devices), such as cells 101a, 101b, 101c, and 101d, portions of which form active regions, or wells, such as active regions 104P and 104N, within the device 100 (or in a substrate thereof, such as substrate 102 in FIG. 2). The active regions 104P are of p-conductivity type (e.g., doped with p-type impurities such as boron), and are suitable for forming NMOSFETs (e.g., n-type FinFETs). The active regions 104N are of n-conductivity type (e.g., doped with n-type impurities such as phosphorous or arsenic), and are suitable for forming PMOSFETs (e.g., p-type FinFETs). As will be discussed in detail below, each of the cells 101a, 101b, 101c, and 101d includes multiple semiconductor fins of p-conductivity type (e.g., in the active regions 104P) suitable for forming n-type FinFETs and multiple semiconductor fins of n-conductivity type (e.g., in the active regions 104N) suitable for forming p-type FinFETs to make up one or more CMOSFETs therein. In many embodiments, each of the cells 101a, 101b, 101c, and 101d is defined by a region oriented lengthwise in the X direction and widthwise in the Y direction. The structure of the cells 101a, 101b, 101c, and 101d are discussed in detail below with reference to FIG. 2.

Figure 3:
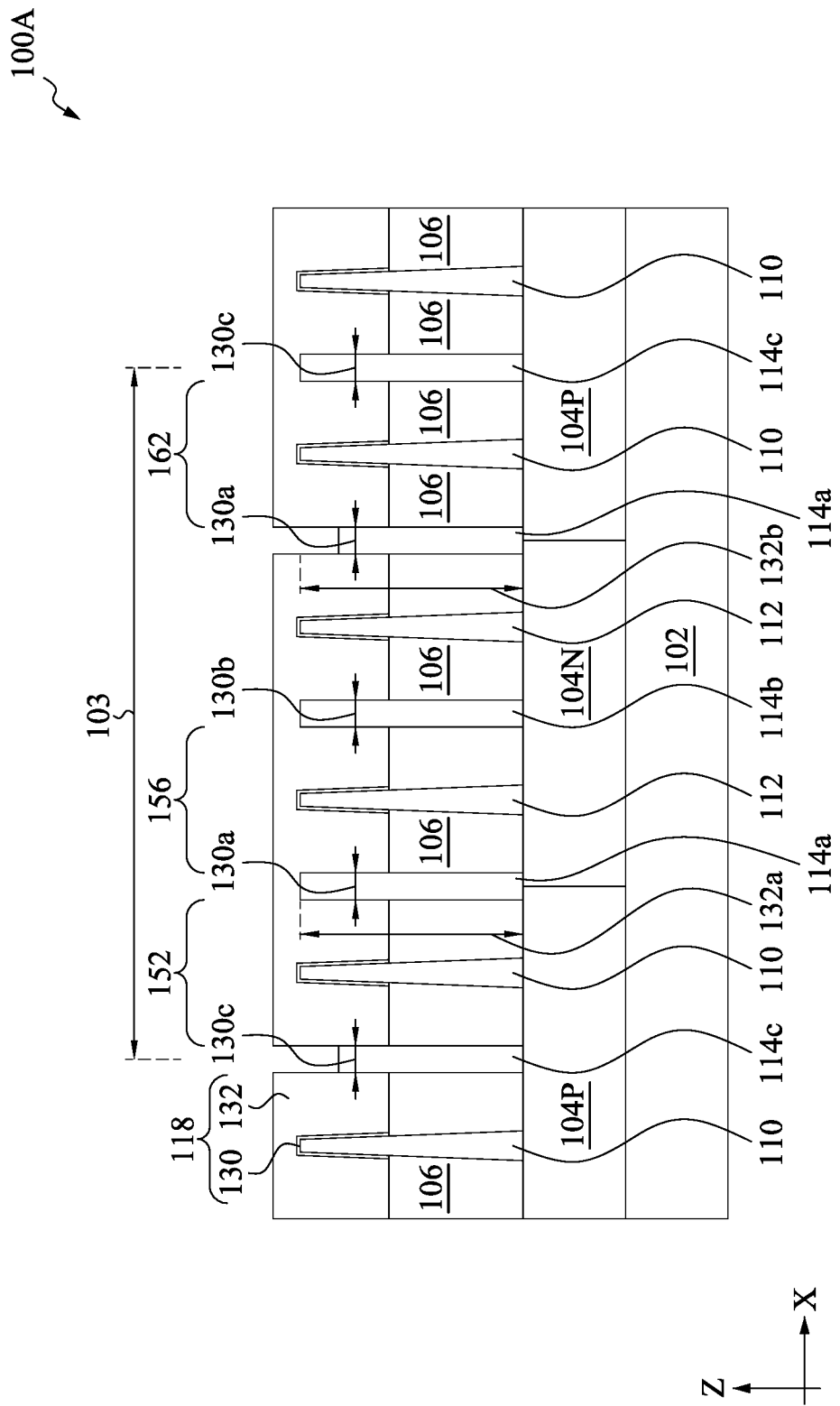
FIG. 3 is a cross-sectional view of the portion of the semiconductor device in FIG. 2 along the line A-A' of FIG. 2, according to some embodiments of the present disclosure.
Figure 4A:
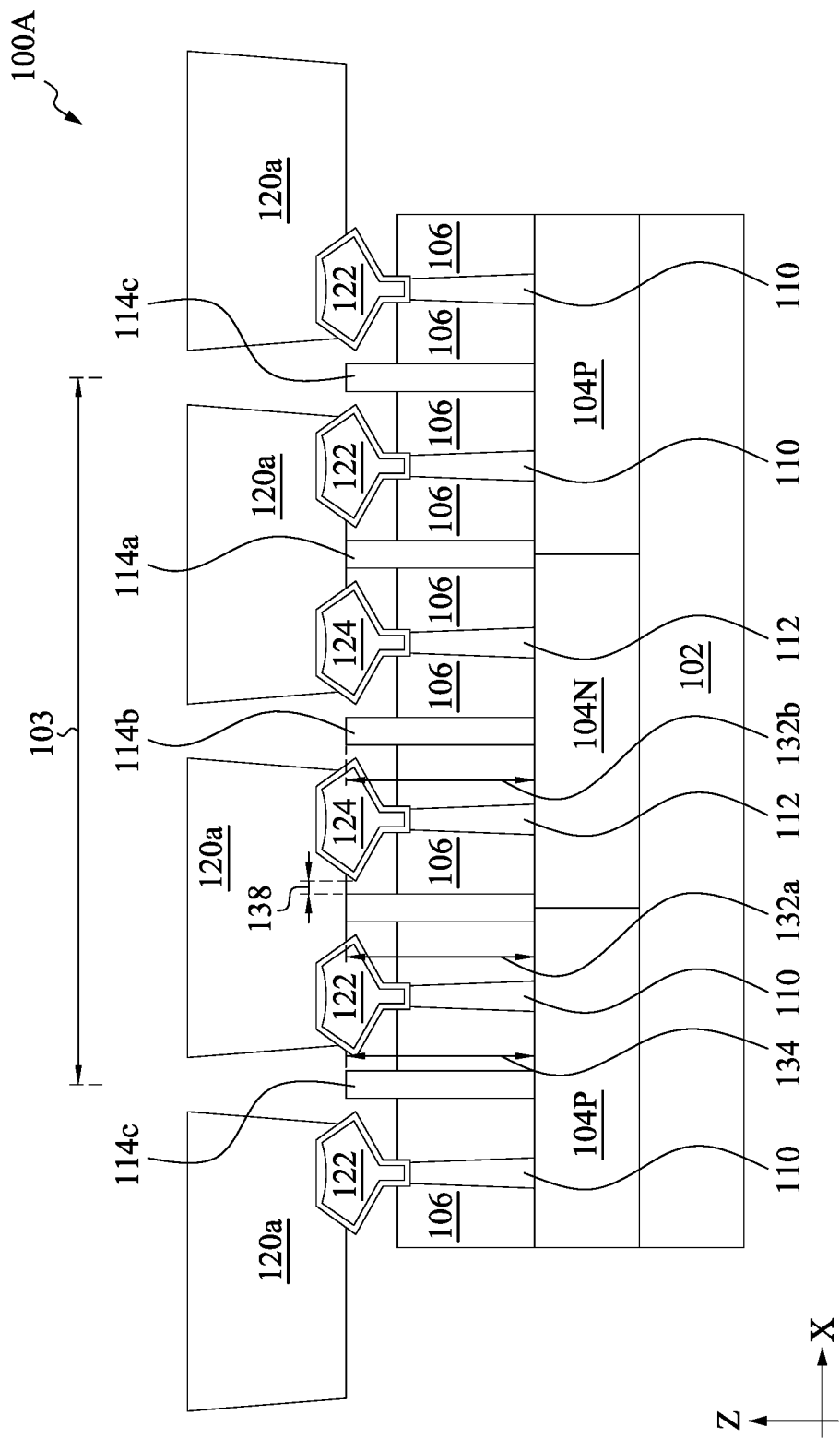
FIGS. 4A, 4B, and 4C are cross-sectional views of the portion of the semiconductor device of FIG. 2 along the line B-B' of FIG. 2, according to some embodiments of the present disclosure.
Figure 4B:
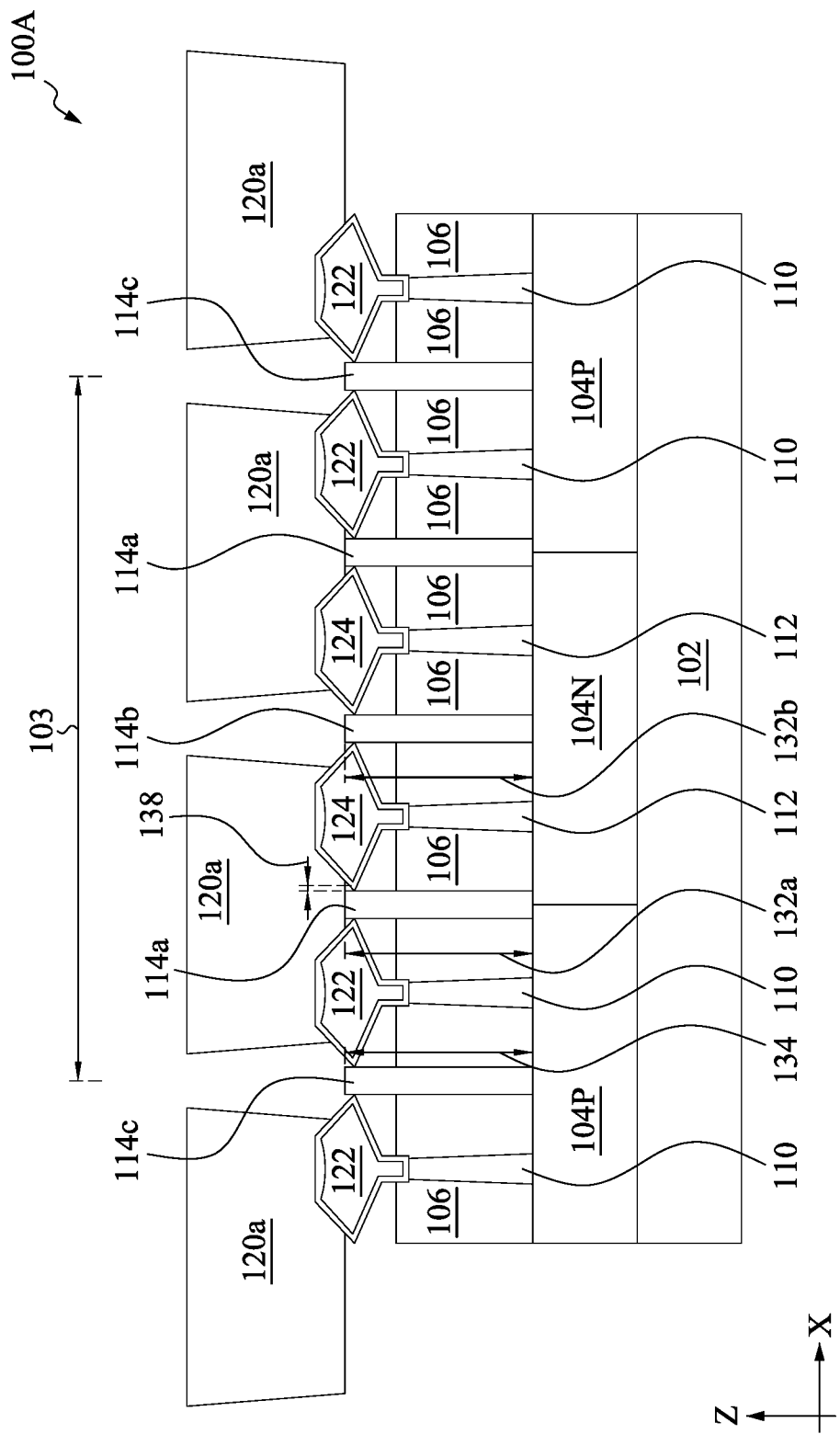
Figure 4C:
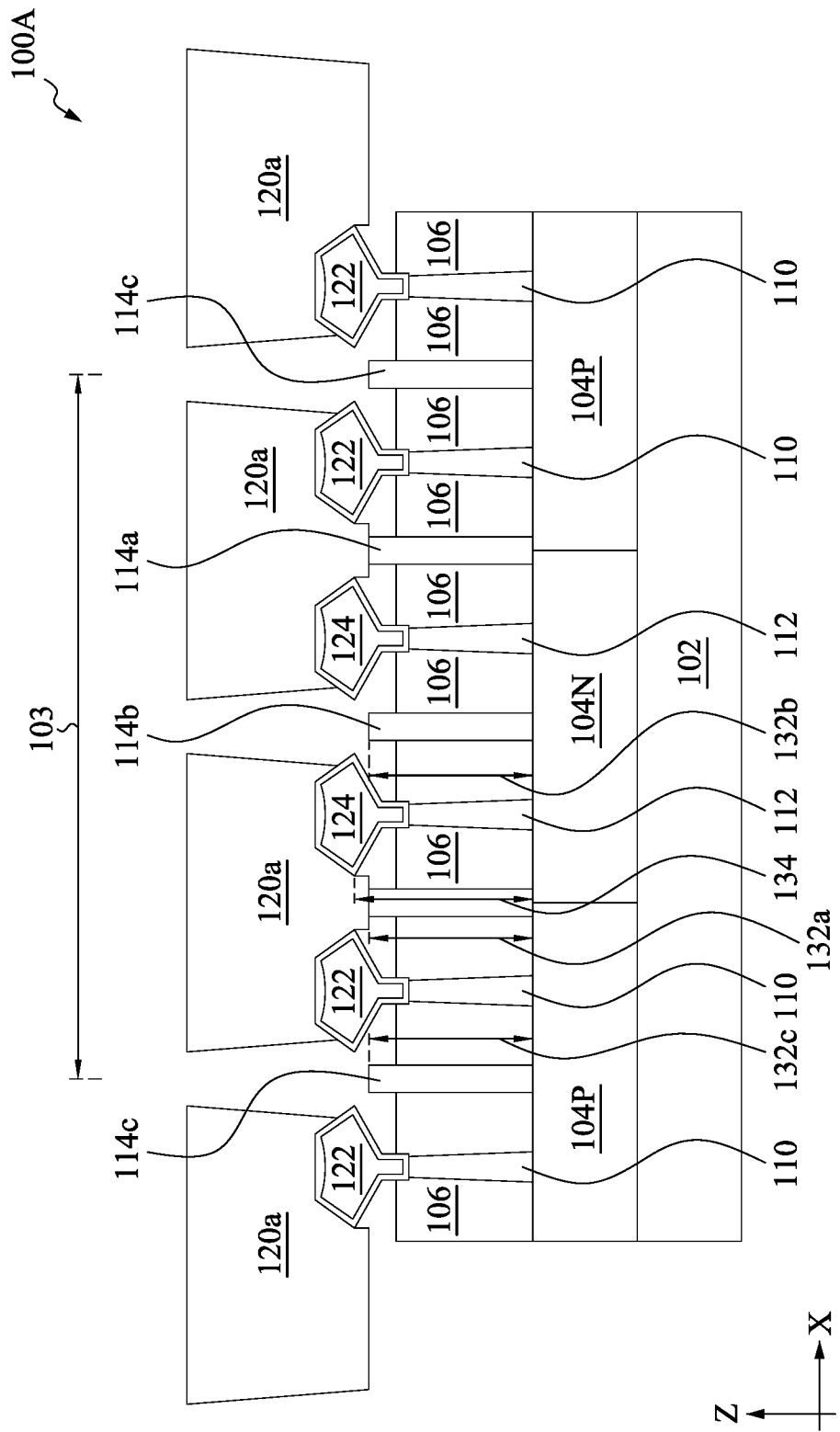

FIG. 2 shows a top view of an embodiment 100A of the device 100. FIG. 3 shows a cross-sectional view of the device 100A along line A-A' (i.e., through a gate structure 118) of FIG. 2, while FIGS. 4A-4C show cross-sectional views of the device 100A along line B-B' (i.e., through S/D contacts 120a) of FIG. 2. Referring to FIGS. 2-4C collectively, the device 100 includes a substrate 102 and the cells 101a, 101b, 101c, and 101d are formed over the substrate 102. As discussed above with reference to FIG. 1, the cells 101a, 101b, 101c, and 101d form multiple active regions 104P and 104N, configured to provide n-type FinFETs and p-type FinFETs, respectively.

Referring to FIG. 2, boundaries (or edges) of the cells 101a, 101b, 101c, and 101d along the Y direction are defined by dielectric fins 114c. In other words, the dielectric fins 114c separate adjacent cells (e.g., cells 101b and 101c or cells 101a and 101d) from one another along the X direction. The dielectric fins 114c are oriented lengthwise along the Y direction and spaced from each other along the X direction. A distance between two adjacent dielectric fins 114c therefore defines a cell pitch 103 along the X direction for each of the cells 101a, 101b, 101c, and 101d.

The cells 101a, 101b, 101c, and 101d, which together define a two-by-two grid, exhibit mirror and/or rotational symmetry with respect to each other. For example, using the cell 101a as a reference (denoted "Cell-Ro" in FIGS. 1 and 2), a layout of the cell 101b (denoted "Cell-$M_x$") is a mirror image of a layout of the cell 101a with respect to the X direction. Similarly, a layout of the cell 101c is a mirror image of the layout of the cell 101b, and a layout of the cell 101d (denoted "Cell-$M_y$") is a mirror image of the layout of the cell 101a, both with respect to the Y direction. In other words, the layout of the cell 101c (denoted "Cell-$R_{180}$") is symmetric to the layout of the cell 101a by a rotation of 180 degrees about a geometric center 105 of the grid, which is defined as an intersection point of an imaginary line bisecting the rectangular grid along the Y direction and an imaginary line bisecting the rectangular grid along the X direction. As depicted in FIG. 2, the imaginary line bisecting the rectangular grid along the Y direction coincides with one of the dielectric fins 114c at the cell boundary.

Referring collectively to FIGS. 2-4C, the device 100 further includes multiple semiconductor fins 110 of p-conductivity type (alternatively referred to as NMOS fins), multiple semiconductor fins 112 of n-conductivity type (alternatively referred to as PMOS fins), and multiple dielectric fins 114a and 114b intermixed with the semiconductor fins 110 and 112. The semiconductor fins 110 and 112 and the dielectric fins 114a and 114b are oriented lengthwise along the Y direction, and are spaced from each other along the X direction. The dielectric fins 114a are disposed between semiconductor fins of different types (e.g., between a semiconductor fin 110 and a semiconductor fin 112), the dielectric fins 114b are disposed between two semiconductor fins 112, and the dielectric fins 114c are disposed between two semiconductor fins 110. As such, the dielectric fins 114a, 114b, and 114c are configured to increase the fin-to-fin spacing between two adjacent semiconductor fins 110 and 112. In some embodiments, the dielectric fins 114b may be omitted from the device 100A. In many embodiments, the semiconductor fins 110 and 112 and the dielectric fins 114a and 114b extend continuously along the Y direction across the cells disposed along the Y direction; though the present disclosure is not limited to such configuration. In the depicted embodiment, each cell (e.g., 101a) includes two semiconductor fins 110 and two semiconductor fins 112 intermixed with two dielectric fins 114a and one dielectric fin 114b, with the boundaries of the cell defined by the dielectric fins 114c along the Y direction.

Referring to FIGS. 3-4C, the device 100A further includes an isolation structure 106 disposed over the substrate 102. The semiconductor fins 110 and 112 and the dielectric fins 114a and 114b are partially embedded in the isolation structure 106. Referring to FIGS. 2 and 3, the device 100A further includes gate structures 118 oriented lengthwise along the X direction, and are spaced from each other along the Y direction. The gate structures 118 engage the semiconductor fins 110 and 112 in each cell to form various FinFETs described in detail below. Furthermore, the gate structures 118 may engage one or more of the dielectric fins 114a, 114b, and 114c disposed between the semiconductor fins 110 and 112. The gate structures 118 are high-k metal gates in some embodiments. The device 100A may further include gate spacers (not depicted) over sidewalls of the gate structures 118. Configurations of the dielectric fins 114a, 114b, and 114c are described below with reference to a cross-sectional view of the device 100A along a gate structure 118 and along S/D contacts 120a, respectively.

Referring to FIGS. 2 and 3, each dielectric fin 114a has a width 130a, each dielectric fin 114b has a width 130b, and each dielectric fin 114c has a width 130c along the X direction. In some embodiments, the widths 130a, 130b, and 130c are substantially the same. In alternative embodiments, the width 130c is greater than the width 130a and the width 130b by, for example, at least 10%. This increase in width is configured to accommodate a greater separation distance between the semiconductor fins 110 disposed on each side of a given dielectric fin 114c so as to improve isolation between the semiconductor fins 110 and increase the landing area for subsequently formed S/D contact. In an example embodiment, the widths 130a, 130b, and 130c each range from about 1 nm to about 40 nm.

Still referring to FIGS. 2 and 3, portions of the dielectric fins 114a, 114b, and 114c may or may not be disposed under (i.e., engaged by) one or more of the gate structures 118. For example, as shown in FIG. 3, the dielectric fins 114c are not disposed under the gate structure 118 while the dielectric fins 114a and 114b are disposed under the gate structure 118. In an example embodiment, a height 132a of each dielectric fin 114a is substantially the same as a height 132b of each dielectric fin 114b, and a height 132c of each dielectric fin 114c is less than the height 132a and the height 132b. Such difference in height may be attributed to the fact that a portion of the dielectric fin 114c is disposed at a location where the gate structure 118 has been truncated during a previous fabrication process (e.g., a "cut metal gate," or CMG, process), thereby shortening a height of the dielectric fin 114c. Of course, the present disclosure also provides embodiments in which portions of the dielectric fins 114a and/or 114b are not disposed under one or more of the gate structures 118 and have a shortened height 132a and/or 132b, respectively.

Referring to FIGS. 2 and 4A-4C collectively, the device 100A further includes S/D epitaxial features 122 and 124 disposed over the semiconductor fins 110 and 112, respectively. The S/D epitaxial features 122 and 124 are disposed on opposite sides of the respective gate structures 118. In the present embodiment, the S/D epitaxial features 122 and 124 are doped with n-type dopants and p-type dopants, respectively. Adjacent S/D epitaxial features 122 and 124 are separated by the dielectric fins 114a, 114b, and 114c.

Still referring to FIGS. 2 and 4A-4C collectively, the device 100A further includes multiple S/D contacts 120a, 120b, 120c, and 120d oriented lengthwise along the X direction. Each S/D contact 120a is disposed over one of the S/D epitaxial features 122, one of the S/D epitaxial features 124, and one of the dielectric fins 114a, 114b, and 114c disposed therebetween. Each S/D contact 120b is disposed over one of the S/D epitaxial features 122 and one of the dielectric fins 114a. Each S/D contact 120c is disposed over one of the S/D epitaxial features 124 and one of the dielectric fins 114b. Each S/D contact 120d is disposed over two S/D epitaxial features 122. In a cross-sectional view, referring to FIGS. 4A-4C, each of the S/D contacts 120a, 120b, 120c, and 120d physically contacts a top surface of one of the dielectric fins 114a, 114b, and 114c. In many embodiments, each cell (e.g., 101a) of the device 100A includes at least two full S/D contacts 120a disposed along the X direction, as well as portions of the S/D contacts 120a, 120b, and 120c disposed along the X direction and spaced from the S/D contacts 120a along the Y direction. In many embodiments, a length of the S/D contact 120a along the X direction is greater than a length of each of the S/D contacts 120b and 120c.

Referring to FIGS. 4A and 4B, the height 132a of the dielectric fins 114a engaged by the S/D contacts 120a are at least the same as a height 134 of each of the S/D epitaxial features 122 and 124 at a widest portion (i.e., an epitaxial growth edge) thereof, so as to prevent adjacent S/D epitaxial features 122 and 124 from merging together. In one example embodiment, a top surface of the dielectric fin 114a is coplanar with the widest portion of the S/D epitaxial features 122 and 124, which are disposed on opposite sides of the dielectric fin 114a. In alternative embodiments, referring to FIG. 4C, the height 132a is less than the height 134, such that a top surface of the dielectric fin 114a (or a bottom surface of each of the S/D contact features 120a) is below the widest portion of the S/D epitaxial features 122 and 124. This may be a result of recessing a portion of the dielectric fin 114a during an earlier etching process for forming a contact hole for the S/D contact 120a. Notably, such recessing allows S/D contacts 120a to contact both the top surface and sidewalls of the S/D epitaxial features 122 and 124, thereby reducing the contact resistance between the S/D contacts 120a and the S/D epitaxial features 122 and 124. In some embodiments, as depicted in FIG. 4A, each of the dielectric fins 114a and 114b is separated from the widest portion of the S/D epitaxial features 122 and 124 by a distance 138, wherein the distance 138 is greater than zero. In alternative embodiments, as depicted in FIG. 4B, each of the dielectric fins 114a and 114b physically contacts the widest portion of the S/D epitaxial features 122 and 124, such that the distance 138 reduces to zero. Furthermore, referring to FIGS. 4A-4C collectively, a height of a dielectric fin not disposed under the S/D contact 120a (e.g., the height 132c and the height 132b of the dielectric fins 114c and 114b, respectively) may be different from that of a dielectric fin disposed under the S/D contact 120a (e.g., the height 132a of the dielectric fin 114a). Alternatively, they may be similar to each other. For example, the height 132a may be higher than, lower than, or the same as (i.e., the top surface of the dielectric fin 114a being coplanar with the top surface of the dielectric fin 114c) the height 132b or 132c as depicted in FIGS. 4A-4C.

Notably, because of the presence of the dielectric fins 114a, 114b, and 114c, the S/D epitaxial features 122 and 124 are given ample space to grow to a maximum or near-maximum volume for improved strain in the resulting FinFETs. Additionally, enlarged growth of the S/D epitaxial features 122 and 124 provide increased landing area for the S/D contact features 120a, 120b, 120c, and 120d, thereby reducing the contact resistance of the device 100A. On the contrary, if the dielectric fins 114a, 114b, and 114c are absent, the S/D epitaxial features 122 and 124 could each only grow to a volume smaller than the maximum volume, compromising the performance of the device.

Figure 5:
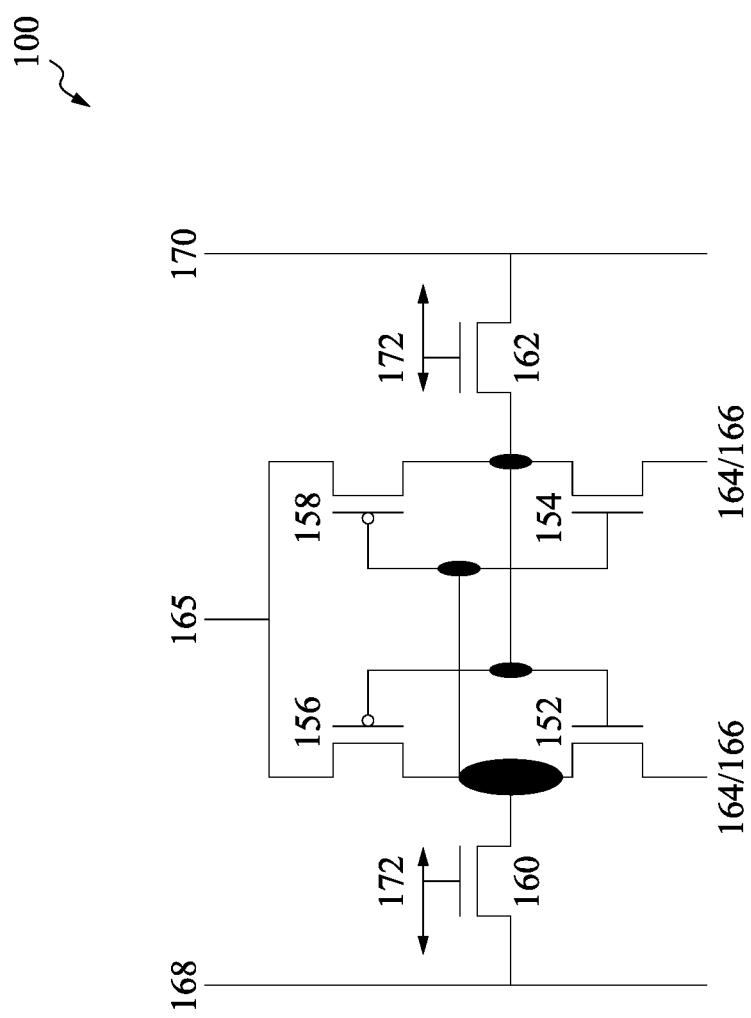
FIG. 5 is a schematic illustration of the portion of the semiconductor device of FIGS. 2-4C, according to some embodiments of the present disclosure.

Referring to FIGS. 2, 3, and 5, each cell (e.g., 101a) includes two pull-down (PD) FinFETs 152 and 154, two pull-up (PU) FinFET 156 and 158, and two pass-gate (PG) FinFETs 160 and 162. Adjacent PD, PU, and PG FinFETs along the X direction are separated by the dielectric fins 114a, 114b, and 114c. The PD FinFETs 152 and 154 and the PG FinFETs 160 and 162 are n-type FinFETs provided by portions of the gate structures 118 engaging the p-type fins 110 disposed in the active regions 104P. The PU FinFETs 156 and 158 are p-type FinFETs provided by portions of the gate structures 118 engaging the n-type fins 112 disposed in the active regions 104N. In many embodiments, the PD FinFETs 152 and 154 and the PU FinFETs 156 and 158 are configured to provide two cross-coupled inverters as data storage device, while the PG FinFETs 160 and 162 are configured to provide control units for reading and writing the data. Referring to FIG. 5, each cell may further include CVss lines 164 and 166, CVdd line 165, bit line 168, bit-line bar 170, and word line 172. In the depicted embodiment, the device 100A includes single-fin FinFETs. In other words, each of the FinFETs includes either a single semiconductor fin 110 or a single semiconductor fin 112. As will be discussed below, the present disclosure is not limited to such configuration.

Figure 6:
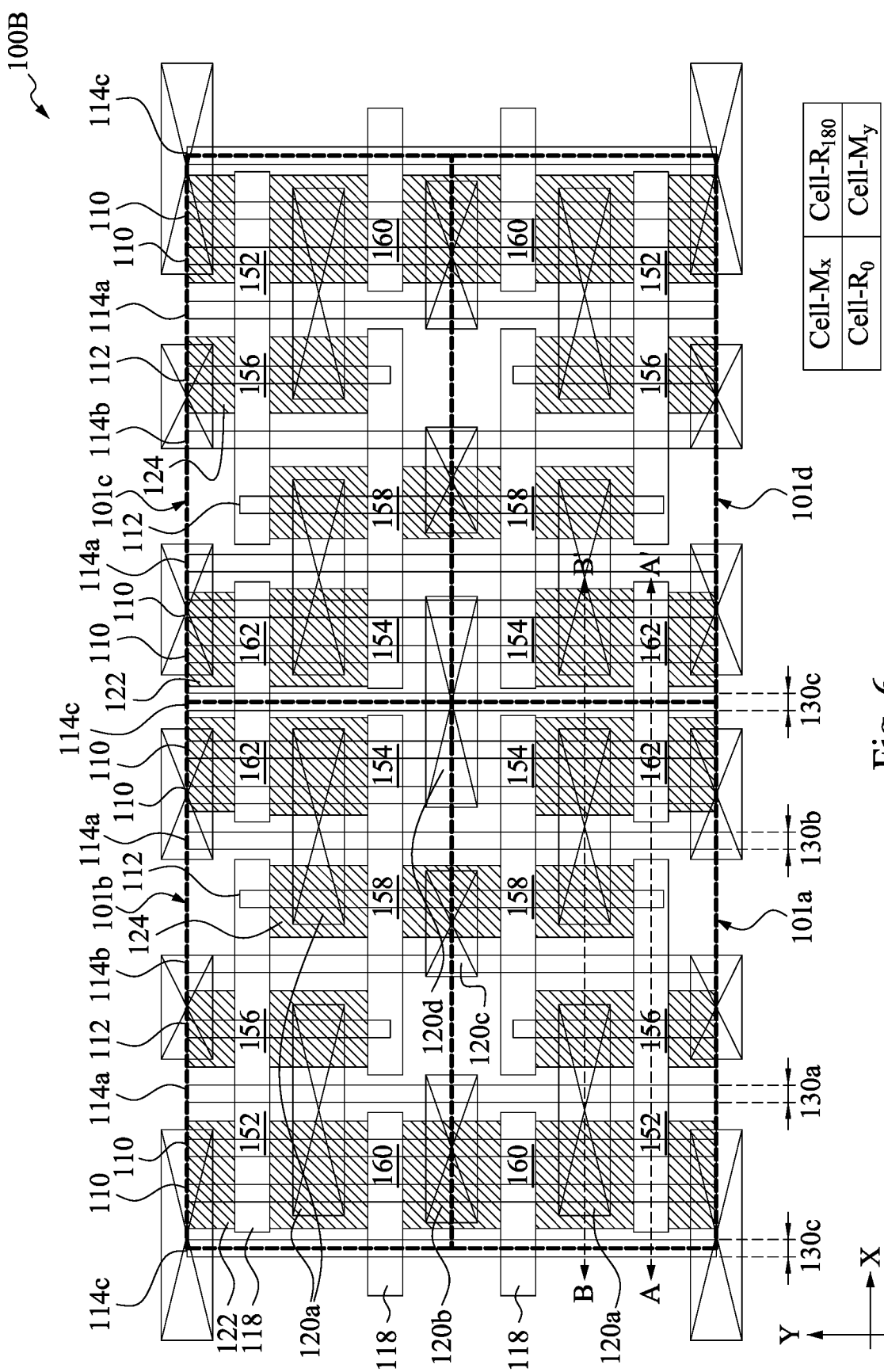
FIG. 6 is a top view of a portion of a semiconductor device, according to some embodiments of the present disclosure.
Figure 7:
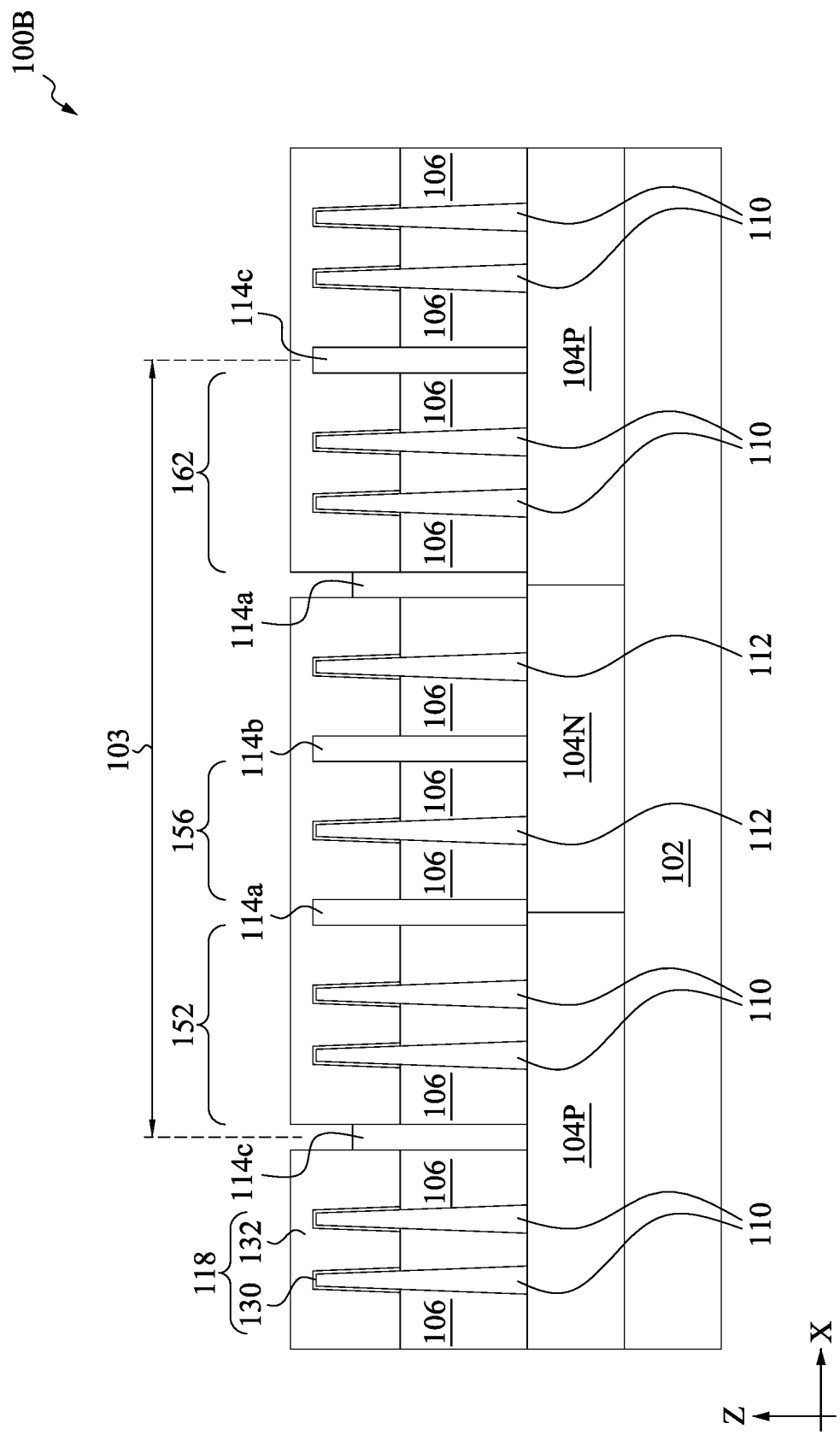
FIGS. 7 and 8 are cross-sectional views of the portion of the semiconductor device of FIG. 6 along the lines A-A' and B-B' of FIG. 6, respectively, according to some embodiments of the present disclosure.
Figure 8:
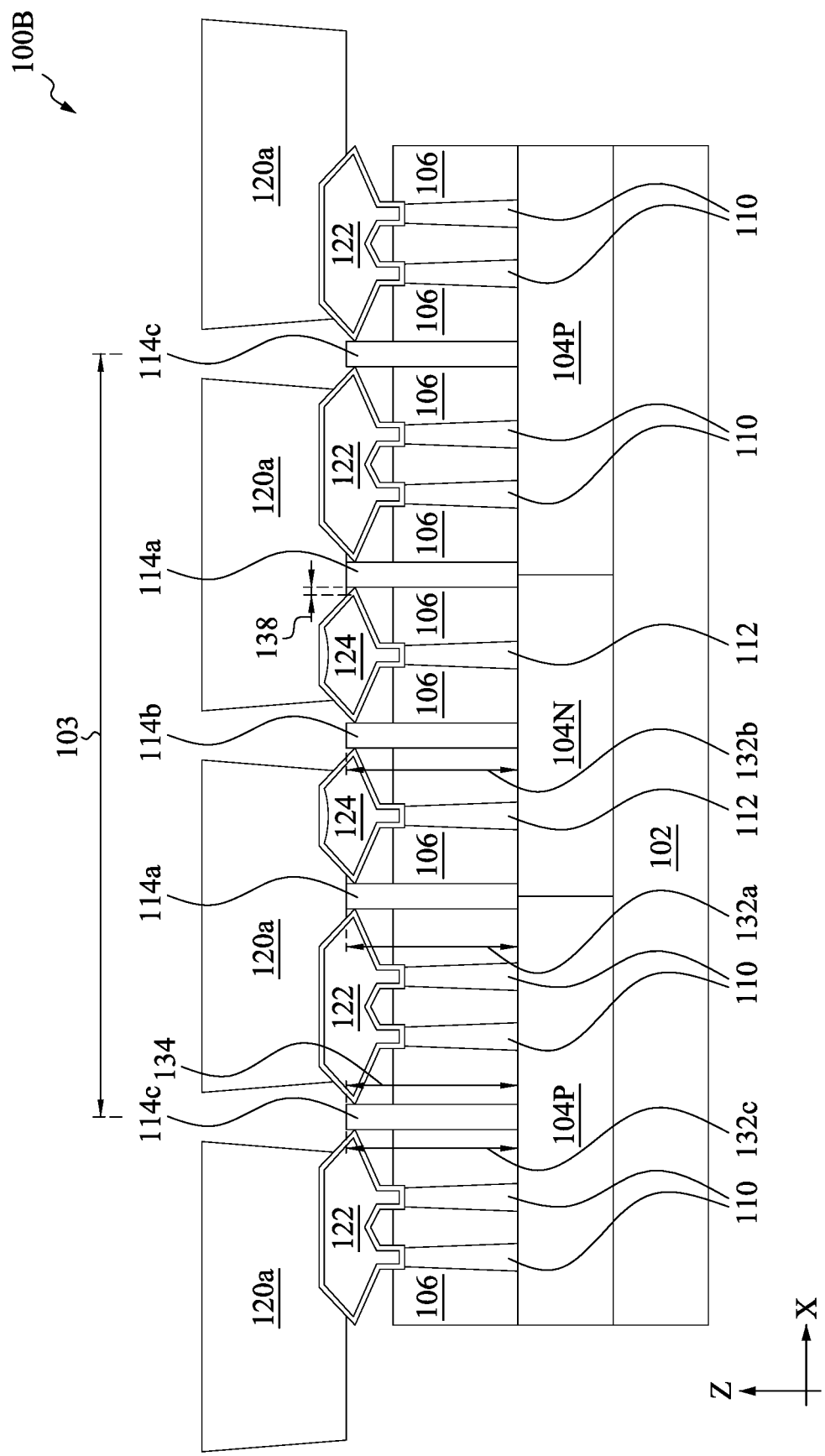

FIG. 6 shows a top view of a device 100B according to another embodiment of the present disclosure. FIG. 7 shows a cross-sectional view of the device 100B along line A-A' (i.e., through the gate structure 118) of FIG. 6, while FIG. 8 shows a cross-sectional view of the device 100B along line B-B' (i.e., through the S/D contacts 120a) of FIG. 6. The device 100B in this embodiment is substantially the same as the device 100A depicted in FIGS. 1-5 except that the device 100B includes multi-fin FinFETs. For example, in this embodiment, each semiconductor FinFET (e.g., PD FinFETs 152 or 154 and the PG FinFETs 160 and 162) includes two semiconductor fins 110. In other words, more than one semiconductor fin 110 is disposed between a dielectric fin 114c and a dielectric fin 114a in the device 100B. Of course, the present disclosure is not limited to two semiconductor fins 110 for each n-type FinFET and may include, for example, three or more semiconductor fins 110. Accordingly, referring to FIG. 8, each S/D epitaxial feature 122 is enlarged by merging the two semiconductor fins 110 together, and the S/D contact 120a lands on the enlarged S/D epitaxial features 122 as well as the S/D epitaxial features 124 and the top surface of the dielectric fin 114a. Other aspects of the device 100B as depicted herein are the same as those of the device 100A depicted and described with reference to FIGS. 1-5, and are omitted for the purpose of brevity.

Figure 9:
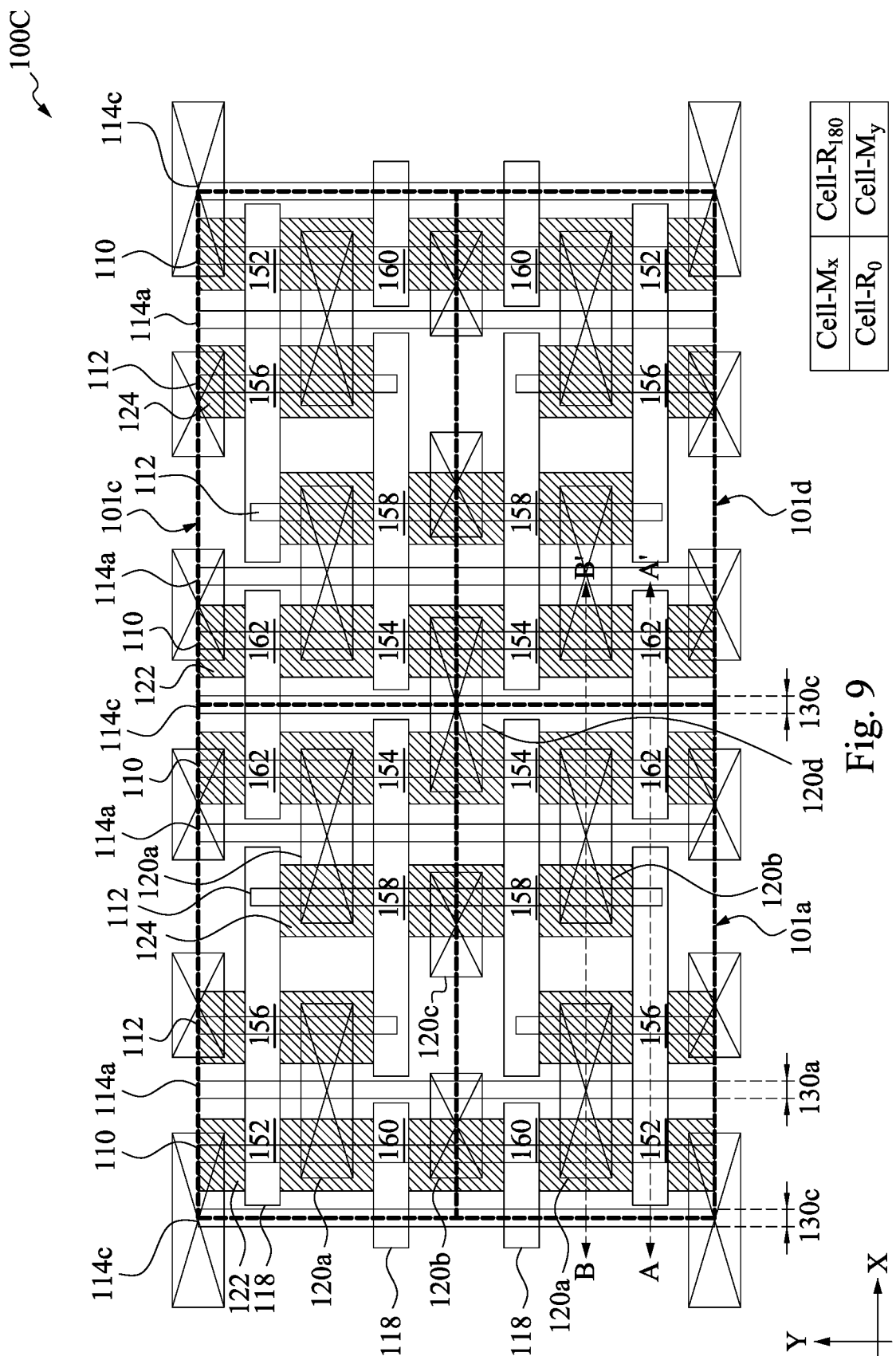
FIG. 9 is a top view of a portion of a semiconductor device, according to some embodiments of the present disclosure.
Figure 10:
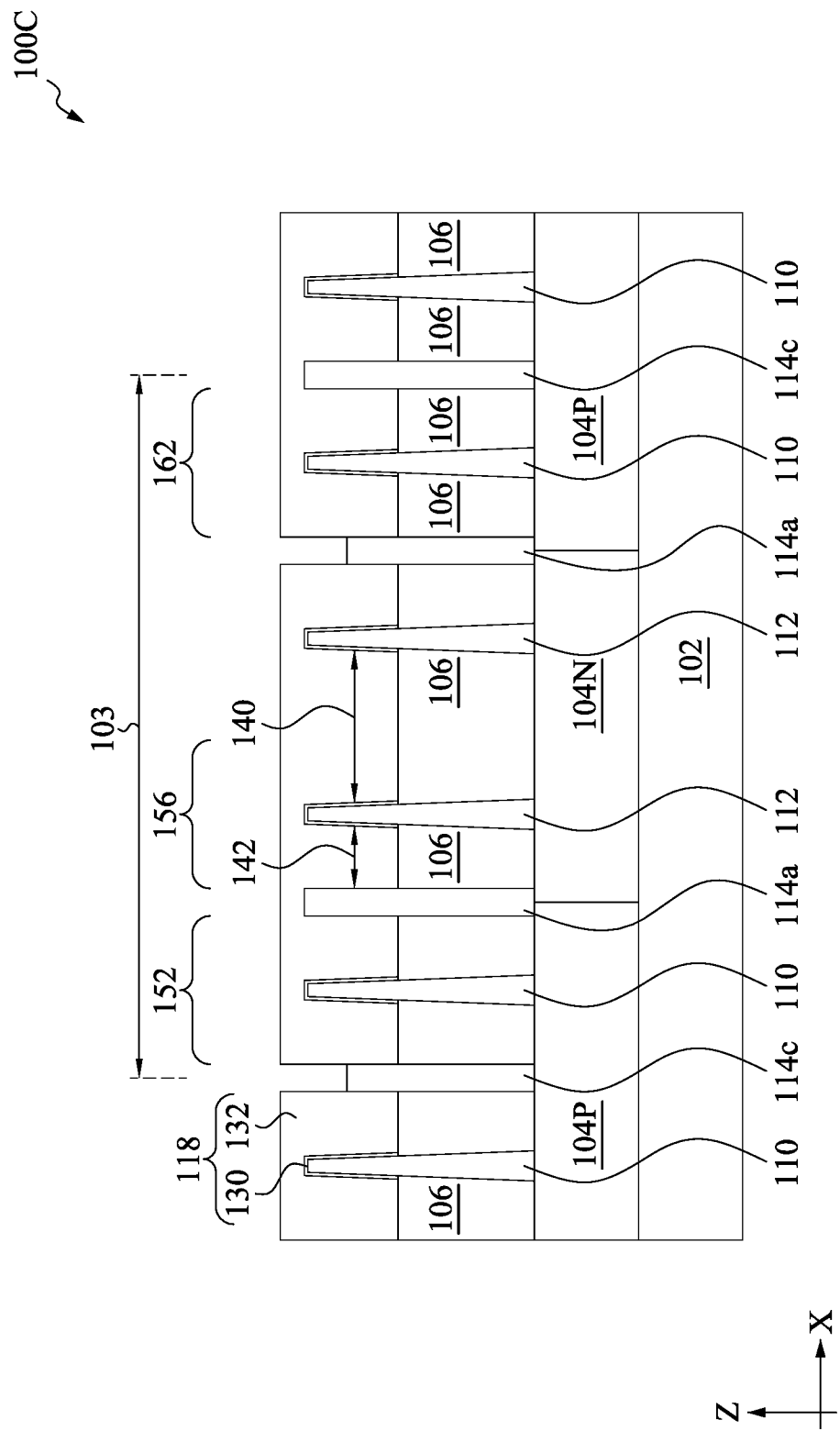
FIGS. 10 and 11 are cross-sectional views of the portion of the semiconductor device of FIG. 9 along the lines A-A' and B-B' of FIG. 9, respectively, according to some embodiments of the present disclosure.
Figure 11:
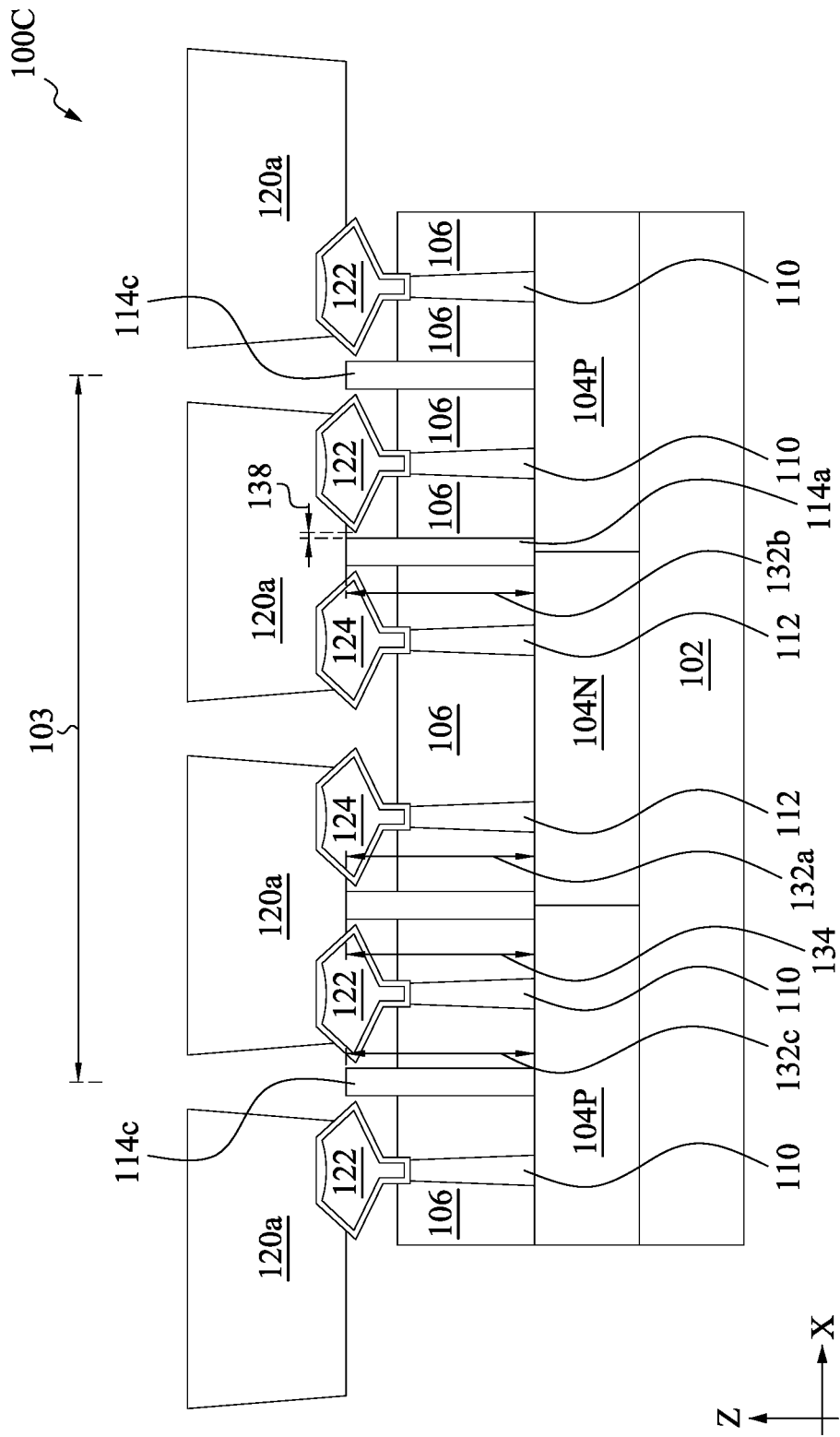

FIG. 9 shows a top view of a device 100C according to yet another embodiment of the present disclosure. FIG. 10 shows a cross-sectional view of the device 100C along line A-A' (i.e., through the gate structure 118) of FIG. 9, while FIG. 11 shows a cross-sectional view of the device 100C along line B-B' (i.e., through the S/D contact features 120a) of FIG. 9. Referring collectively to FIGS. 9-11, the device 100C in this embodiment is substantially the same as the device 100A depicted in FIGS. 1-5 except that dielectric fin 114b is absent in the active region 104N within each cell. In other words, the two semiconductor fins 112 disposed in each cell are adjacent to each other and not separated by the dielectric fin 114b. In an example embodiment, each cell of the device 100C includes two semiconductor fins 110, two semiconductor fins 112, and two dielectric fins 114a, with the boundaries of the cell defined by the dielectric fins 114c. Because the S/D epitaxial features 124 are smaller in volume compared to the S/D epitaxial feature 122, disposing the two semiconductor fins 112 to adjacent each other without the dielectric fin 114b disposed therebetween would not lead to the S/D epitaxial features 124 merging together. Additionally, removing the dielectric fin 114b from between the two semiconductor fins 112 may be beneficial for reducing the overall size of the SRAM cell in the device 100C. Accordingly, referring to FIG. 10, a distance 140 between the two semiconductor fins 112 may be reduced to less than a distance 142 between the semiconductor fin 112 and a neighboring dielectric fin 114a, thereby increasing the density of the FinFET devices. Other aspects of the device 100C as depicted herein are the same as those of the device 100A depicted and described with reference to FIGS. 1-5, and are omitted for the purpose of brevity.

Configurations of the dielectric fins 114a, 114b, and 114c of the device 100A depicted and described with reference to FIGS. 4A-4C may be equally applicable to devices 100B and 100C. For example, referring to FIGS. 8 and 11, the height 132a and the height 132b may be at least the same as the height 134 measured at the widest portion of the S/D epitaxial features 122 and 124. Alternatively, the height 132a and the height 132b may be less than the height 134. The distance 138 between the widest portions of the S/D epitaxial features 122 and 124 and the dielectric fins 114a, 114b, and/or 114c may be greater than zero or, alternatively, be equal to zero such that the widest portion of the S/D epitaxial features 122 and 124 physically contacts the dielectric fins 114a, 114b, and/or 114c. Furthermore, the height of portions of the dielectric fins 114a, 114b, and 114c not disposed under by the S/D contact features 120a may be greater than, less than, or equal to the height of portions of the dielectric fins 114a, 114b, and 114c disposed under the S/D contact features 120a.

The devices 100A, 100B, and/or 100C may further include other components not shown in FIGS. 2-8, such as an etch stop layer over the S/D epitaxial features 122 and 124, pre-metallization dielectric (PMD) layer(s), interlayer dielectric (ILD) layers, vias and contacts, and metal lines for connecting various cells in the IC.

The various components of the device 100 are further described below. The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as having a buried dielectric layer.

The semiconductor fins 110 and 112 may include one or more semiconductor materials such as silicon, germanium, or silicon germanium. In an embodiment, each of the semiconductor fins 110 and 112 may include multiple different semiconductor layers stacked one over the other. The semiconductor fins 110 and 112 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 110 and 112 by etching initial epitaxial semiconductor layers of the substrate 102. The etching process can include dry etching, wet etching, reactive ion etching (RIE), and/or other suitable processes. The semiconductor fins 110 and 112 may be doped with proper dopants as discussed above.

The isolation structure 106 may include silicon oxide, silicon nitride, silicon oxynitride, fluoride-doped silicate glass (FSG), a low-k dielectric material, and/or other suitable insulating material. The isolation structure 106 may be shallow trench isolation (STI) features. In an embodiment, the isolation structure 106 is formed by etching trenches in the substrate 102, e.g., as part of the fins 110 and 112 formation process. The trenches may then be filled with isolating material, followed by a chemical mechanical planarization (CMP) process and/or an etch-back process. In another embodiment, the isolation structure 106 is formed by depositing a dielectric material over the sidewalls of the semiconductor fins 110 and 112 without fully filling the trenches between the semiconductor fins 110 and 112. In other words, the isolation structure 106 is formed as a fin sidewall spacer. Other isolation structure such as field oxide, LOCal Oxidation of Silicon (LOCOS), and/or other suitable structures are possible. The isolation structure 106 may include a multi-layer structure, for example, having one or more thermal oxide liner layers.

In the present embodiment, each dielectric fin 114a is disposed between two semiconductor fins that are of different conductivity types (i.e., between a semiconductor fin 110 and a semiconductor fin 112), each dielectric fin 114b is disposed between two semiconductor fins that are of n-type (i.e., between two semiconductor fins 112), and each dielectric fin 114c is disposed between two semiconductor fins that are of p-type (i.e., between two semiconductor fins 110). The dielectric fins 114a and 114b enlarge a separation distance between neighboring semiconductor fins, which offers benefits such as preventing merging of adjacent S/D epitaxial features and increasing a landing area for an S/D contact feature over the S/D epitaxial features.

Each of the dielectric fins 114a, 114b, and 114c may include a single dielectric material or multiple dielectric materials. For example, the dielectric fins 114a, 114b, and 114c may each include silicon oxide (e.g., $SiO_2$), silicon oxycarbide (e.g., SiOC), silicon oxycarbide nitride (SiOCN), silicon oxide with carbon contents, silicon oxide with nitrogen contents, a nitride based dielectric, a metal oxide based dielectric, hafnium oxide ($HfO_2$), tantalum oxide ($Ta_2O_5$), titanium oxide ($TiO_2$), zirconium oxide ($ZrO_2$), aluminum oxide ($Al_2O_3$), yttrium oxide ($Y_2O_3$), other suitable dielectric materials, or a combination thereof.

In an embodiment, the isolation structure 106 is deposited as a spacer layer over the sidewalls of the semiconductor fins 110 and 112. Before the isolation structure 106 is recessed to be lower than the semiconductor fins 110 and 112, trenches are formed in the isolation structure 106 by patterning and etching process(es). Thereafter, dielectric material(s) are deposited in the trenches to form the dielectric fins 114a, 114b, and 114c. The dielectric material(s) may be deposited using chemical vapor deposition (CVD), physical vapor deposition (PVD), atomic layer deposition (ALD), flowable CVD (FCVD), or other suitable methods. The isolation structure 106 is then planarized (e.g., by one or more CMP processes) to expose a top surface of each of the semiconductor fins 110 and 112 and a top surface of each of the dielectric fins 114a, 114b, and 114c. Thereafter, the isolation structure 106 is recessed (e.g., by a chemical etching process) to be lower than the top surface of each of the semiconductor fins 110 and 112 and the top surface of each of the dielectric fins 114a, 114b, and 114c.

The gate structures 118 include a gate dielectric layer 130 and a gate electrode layer 132. The gate dielectric layer 130 may include silicon oxide ($SiO_2$), silicon oxynitride (SiON), aluminum silicon oxide (AlSiO), a high-k dielectric material such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layer 130 may be deposited by chemical oxidation, thermal oxidation, atomic layer deposition (ALD), or other suitable methods. The gate electrode layer 132 may include a work function metal layer, a metal fill layer, and other suitable layers such as barrier layer(s) and capping layer(s). The work function metal layer may be a p-type or an n-type work function layer for the p-type FinFETs and n-type FinFETs, respectively. The p-type work function layer comprises a metal such as titanium nitride (TiN), tantalum nitride (TaN), ruthenium (Ru), molybdenum (Mo), tungsten (W), platinum (Pt), or combinations thereof. The n-type work function layer comprises a metal such as titanium (Ti), aluminum (Al), tantalum carbide (TaC), tantalum carbide nitride (TaCN), tantalum silicon nitride (TaSiN), or combinations thereof. The work function metal layer may include a plurality of layers and may be deposited by CVD, physical vapor deposition (PVD), and/or other suitable process. The metal fill layer may include aluminum (Al), tungsten (W), cobalt (Co), copper (Cu), and/or other suitable materials. The metal fill layer may be formed by CVD, PVD, plating, and/or other suitable processes.

The devices 100A, 100B, and/or 100C may each further include gate spacer (not depicted) disposed along sidewalls of each gate structure 118. The gate spacer may include one or more dielectric layers having silicon nitride ($Si_3N_4$), silicon oxide ($SiO_2$), silicon carbide (SiC), silicon carbide nitride (SiCN), silicon oxynitride (SiON), silicon oxycarbide (SiOC), silicon oxycarbide nitride (SiOCN), a low-k dielectric material, other materials, or a combination thereof. The gate spacer may be formed by one or more methods including chemical oxidation, thermal oxidation, ALD, CVD, and/or other suitable methods.

The S/D epitaxial features 122 may include epitaxially grown semiconductor material(s) such as epitaxially grown silicon or silicon carbon for n-type FinFETs, and may additionally include one or more n-type dopants, such as phosphorus or arsenic. The S/D epitaxial features 124 may include epitaxially grown semiconductor material(s) such as epitaxially grown silicon germanium for p-type FinFETs, and may additionally include one or more p-type dopants, such as boron or indium. In some embodiments, a concentration of germanium in the S/D epitaxial features 124 is higher than a concentration of germanium in channel regions of the semiconductor fins 112. The S/D epitaxial features 122 and 124 may be formed by a low-pressure CVD (LPCVD) process with a silicon-based precursor, a selective epitaxial growth (SEG) process, a cyclic deposition and etching (CDE) process, or other epitaxial growth processes. In many embodiments, the dielectric fins 114a, 114b, and 114c are tall enough to prevent nearby S/D epitaxial features 122 and 124 from accidentally merging with, thus shorting, each other.

Although not intended to be limiting, one or more embodiments of the present disclosure provide many benefits to a semiconductor device. For example, embodiments of the present disclosure provide dielectric fins inserted between active semiconductor fins for isolating adjacent semiconductor fins. Due to the presence of the dielectric fins, the S/D epitaxial features can be grown to maximum or near-maximum volume, which increases strain to the channel and increases S/D contact landing area for reduced S/D contact resistance.

In one exemplary aspect, the present disclosure is directed to an integrated circuit (IC) that includes an SRAM cell having first, second, third, fourth, and fifth dielectric fins disposed in this order along a first direction and oriented lengthwise along a second direction, where the first and the fifth dielectric fins define two edges of the SRAM cell; a first n-type semiconductor fin disposed between the first and the second dielectric fins; a second n-type semiconductor fin disposed between the fourth and the fifth dielectric fins; a first p-type semiconductor fin disposed between the second and the third dielectric fins; a second p-type semiconductor fin disposed between the third and the fourth dielectric fins, where each of the first and the second n-type semiconductor fins and each of the first and the second p-type semiconductor fins is oriented lengthwise along the second direction; and gate structures oriented lengthwise along the first direction, where the gate structures engage one or more of the dielectric fin.

In some embodiments, the IC further includes a second SRAM cell disposed next to the first SRAM cell along the second direction, where an layout of the second SRAM cell is a mirror image of layout of the first SRAM cell with respect to a first imaginary boundary line in the first direction; a third SRAM cell disposed next to the second SRAM cell along the first direction, where a layout of the third SRAM cell is a mirror image of the layout of the second SRAM cell with respect to a second imaginary boundary line going through the fifth dielectric fin lengthwise; and a fourth SRAM cell disposed next to the third SRAM cell along the second direction and next to the first SRAM cell along the first direction, where a layout of the fourth SRAM cell is a mirror image of the layout of the first SRAM cell with respect to the second imaginary boundary line.

In some embodiments, only one p-type semiconductor fin is disposed between the first and the second dielectric fins and between the fourth and the fifth dielectric fins.

In some embodiments, the IC further includes one or more p-type semiconductor fins disposed between the first and the second dielectric fins and between the fourth and the fifth dielectric fins.

In some embodiments, the IC further includes source/drain (S/D) epitaxial features each disposed over a portion of each of the first and the second p-type semiconductor fins and the first and the second n-type semiconductor fins. In further embodiments, a first S/D contact is disposed over and physically contacts the S/D epitaxial feature over the first p-type semiconductor fin, the S/D epitaxial feature over the first n-type semiconductor fin, and the second dielectric fin, and a second S/D contact is disposed over and physically contacts the S/D epitaxial feature over the second p-type semiconductor fin, the S/D epitaxial feature over the second n-type semiconductor fin, and the fourth dielectric fin.

In some embodiments, each of the first, the second, the third, the fourth, and the fifth dielectric fin includes silicon oxide, silicon oxycarbide, silicon oxynitride, silicon oxycarbonitride, titanium oxide, zirconium oxide, aluminum oxide, yttrium oxide, or combinations thereof.

In some embodiments, portions of the first, the second, the third, the fourth, and the fifth dielectric fins directly under the gate structures have a first height, and portions of the first, the second, the third, the fourth, and the fifth dielectric fin not under the gate structures have a second height, the first height being greater than the second height.

In another exemplary aspect, the present disclosure is directed to a semiconductor device having first, second, third, and fourth SRAM cells arranged clockwise in a grid, the grid being oriented lengthwise in a first direction and widthwise in a second direction generally perpendicular to the first direction, where each of the first, the second, the third, and the fourth SRAM cells includes: a first p-type semiconductor fin disposed between a first boundary dielectric fin and a first inner dielectric fin; a first and a second n-type semiconductor fins disposed between the first inner dielectric fin and a second inner dielectric fin; a second p-type semiconductor fin disposed between the second inner dielectric fin and a second boundary dielectric fin; source/drain (S/D) epitaxial features each disposed over each of the first and the second p-type semiconductor fins and the first and the second n-type semiconductor fins; a first S/D contact disposed over and physically contacting the S/D epitaxial feature over the first p-type semiconductor fin, the S/D epitaxial feature over the first n-type semiconductor fin, and the first inner dielectric fin; and a second S/D contact disposed over and physically contacting the S/D epitaxial feature over the second p-type semiconductor fin, the S/D epitaxial feature over the second n-type semiconductor fin, and the second inner dielectric fin. In some embodiments, the first and the second boundary dielectric fins, the first and the second inner dielectric fins, the first and the second p-type semiconductor fins, and the first and the second n-type semiconductor fins are oriented lengthwise along the second direction, and the first and the second S/D contacts are oriented lengthwise along the first direction. In further embodiments, the first SRAM cell is disposed on a bottom-left corner of the grid and the second SRAM cell is disposed next to the first SRAM cell along the second direction, and the third and the fourth SRAM cells are mirror images of the second and the first SRAM cells, respectively, about the second direction.

In some embodiments, in a cross-sectional view through the first S/D contact lengthwise, a widest portion of the S/D epitaxial feature over the first p-type semiconductor fin and a widest portion of the S/D epitaxial feature over the first n-type semiconductor fin physically contact the first inner dielectric fin. In some embodiments, in a cross-sectional view through the first S/D contact lengthwise, a top surface of the first inner dielectric fin is below a widest portion of the S/D epitaxial feature over the first p-type semiconductor fin and a widest portion of the S/D epitaxial feature over the first n-type semiconductor fin.

In some embodiments, in a cross-sectional view through the second S/D contact lengthwise, a top surface of the second inner dielectric fin is substantially coplanar with the widest portion of the S/D epitaxial feature over the second n-type semiconductor fin and the widest portion of the S/D epitaxial feature over the second p-type semiconductor fin.

In some embodiments, in a cross-sectional view through the first and the second S/D contacts lengthwise, a top surface of each of the first and the second boundary dielectric fins is above a top surface of each of the first and the second inner dielectric fins. In further embodiments, in a cross-sectional view through the first and the second S/D contacts lengthwise, a top surface of each of the first and the second boundary dielectric fins is substantially coplanar with a top surface of each of the first and the second inner dielectric fins.

In still further embodiments, in a cross-sectional view through the first and the second S/D contacts lengthwise, a separation distance between a widest portion of the S/D epitaxial feature over the first n-type semiconductor fin and a widest portion of the S/D epitaxial feature over the second n-type semiconductor fin is less than another separation distance between the widest portion of the S/D epitaxial feature over the first n-type semiconductor fin and a widest portion of the S/D epitaxial feature over the first p-type semiconductor fin.

In yet another exemplary aspect, the present disclosure is directed to an IC that includes a first SRAM cell oriented lengthwise along a first direction and widthwise along a second direction generally perpendicular to the first direction, where the SRAM cell includes first, second, third, and fourth dielectric fins disposed in this order along the first direction and oriented lengthwise along the second direction; a first p-type semiconductor fin disposed between the first and the second dielectric fins; a second p-type semiconductor fin disposed between the third and the fourth dielectric fins; a first and a second n-type semiconductor fins disposed between the second and the third dielectric fins, where each of the first and the second p-type semiconductor fins and each of the first and the second n-type semiconductor fins is oriented lengthwise along the second direction; and gate structures oriented lengthwise along the first direction and spaced from each other along the second direction. In some embodiments, the first and the fourth dielectric fins define two edges of the first SRAM cell. In some embodiments, the gate structures engage the first p-type semiconductor fin to form a first pass-gate (PG) field effect transistor (FET) and a first pull-down (PD) FET, engage the first n-type semiconductor fin to form a first pull-up (PU) FET, engage the second p-type semiconductor fin to form a second PG FET and a second PD FET, and engage the second n-type semiconductor fin to form a second PU FET.

In some embodiments, the IC further includes a second SRAM cell disposed next to the first SRAM cell along the second direction, where an layout of the second SRAM cell is a mirror image of the layout of the first SRAM cell with respect to a first imaginary boundary line in the first direction; a third SRAM cell disposed next to the second SRAM cell along the first direction, where an layout of the third SRAM cell is a mirror image of the layout of the second SRAM cell with respect to a second imaginary boundary line going through the fourth dielectric fin lengthwise; and a fourth SRAM cell disposed next to the third SRAM cell along the second direction and next to the first SRAM cell along the first direction, where an layout of the fourth SRAM cell is a mirror image of the layout of the first SRAM cell with respect to the second imaginary boundary line.

In some embodiments, a space between the first and the second n-type semiconductor fins is free of any dielectric fin.

In some embodiments, the first PU FET and the first PD FET are configured to form a first inverter, and the second PU FET and the second PD FET are configured to form a second inverter, the first inverter and the second inverter being cross-coupled.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), the IC comprising: an SRAM cell oriented lengthwise along a first direction and widthwise along a second direction generally perpendicular to the first direction, wherein the first SRAM cell includes:
    a first, a second, a third, a fourth, and a fifth dielectric fins disposed in this order along the first direction and oriented lengthwise along the second direction, wherein the first and the fifth dielectric fins define two edges of the first SRAM cell, and wherein the first, the second, the third, the fourth, and the fifth dielectric fins are disposed in isolation structures over a substrate;
    a first p-type semiconductor fin structure disposed between the first and the second dielectric fins;
    a second p-type semiconductor fin structure disposed between the fourth and the fifth dielectric fins;
    a first n-type semiconductor fin structure disposed between the second and the third dielectric fins,
    a second n-type semiconductor fin structure disposed between the third and the fourth dielectric fins,
    wherein the first and the second p-type semiconductor fin structures and the first and the second n-type semiconductor fin structures are oriented lengthwise along the second direction and separated from each of the first, second, third, fourth, and fifth dielectric fins by portions of the isolation structures; and
    gate structures oriented lengthwise along the first direction and spaced from each other along the second direction, wherein the gate structures engage one or more of the first, the second, the third, the fourth, and the fifth dielectric fins, the first and the second n-type semiconductor fin structures, and the first and the second p-type semiconductor fin structures;
    wherein portions of the first, the second, the third, the fourth, and the fifth dielectric fins disposed under the gate structures have a first height, wherein portions of the first, the second, the third, the fourth, and the fifth dielectric fin not disposed under the gate structures have a second height, and wherein the first height is greater than the second height.

2. The IC of claim 1, wherein each of the first and the second p-type semiconductor fin structures includes two p-type semiconductor fins, and wherein each of the first and the second n-type semiconductor fin structures consists of one n-type semiconductor fin.

3. The IC of claim 1, wherein each of the first and the second p-type semiconductor fin structures consists of one p-type semiconductor fin, and wherein each of the first and the second n-type semiconductor fin structures consists of one n-type semiconductor fin.

4. The IC of claim 1, further comprising:
    a first source/drain (S/D) feature disposed over the first p-type semiconductor fin structure;
    a second S/D feature disposed over the second p-type semiconductor fin structure;
    a third S/D feature disposed over the first n-type semiconductor fin structure;
    a fourth S/D feature disposed over the second n-type semiconductor fin structure;
    a first S/D contact physically contacting the first S/D feature, the third S/D feature, and the second dielectric fin; and
    a second S/D contact physically contacting the second S/D feature, the fourth S/D feature, and the fourth dielectric fin.

5. The IC of claim 4, wherein both of the first and the third S/D features physically contact the second dielectric fin, wherein both of the second and the fourth S/D features physically contact the fourth dielectric fin, and wherein both of the third and the fourth S/D features physically contacting the third dielectric fin.

6. The IC of claim 1, wherein the gate structures engage with the first p-type semiconductor fin structure to form a first pull-down (PD) transistor and a first pass-gate (PG) transistor, wherein the gate structures engage with the second p-type semiconductor fin structure to form a second PD transistor and a second PG transistor, and wherein the gate structures engage with the first and the second n-type semiconductor fin structures to form a first pull-up (PU) transistor and a second PU transistor, respectively.

7. The IC of claim 1, wherein an isolation structure surrounds a bottom portion of each of the first, second, third and fourth dielectric fins.

8. An integrated circuit (IC), the IC comprising:
an SRAM cell oriented lengthwise along a first direction and widthwise along a second direction generally perpendicular to the first direction, wherein the first SRAM cell includes:
  a first, a second, a third, a fourth, and a fifth dielectric fins disposed in this order along the first direction and oriented lengthwise along the second direction, wherein the first and the fifth dielectric fins define two edges of the first SRAM cell, and wherein the first, second, third, fourth, and fifth dielectric fins are disposed in isolation structures over a substrate;
  a first p-type semiconductor fin structure disposed between the first and the second dielectric fins;
  a second p-type semiconductor fin structure disposed between the fourth and the fifth dielectric fins;
  a first n-type semiconductor fin structure disposed between the second and the third dielectric fins,
  a second n-type semiconductor fin structure disposed between the third and the fourth dielectric fins,
  wherein the first and the second p-type semiconductor fin structures and the first and the second n-type semiconductor fin structures are oriented lengthwise along the second direction and separated from each of the first, the second, the third, the fourth, and the fifth dielectric fins by portions of the isolation structures;
  a source/drain (S/D) epitaxial features disposed over each of the first and the second p-type semiconductor fin structures and the first and the second n-type semiconductor fin structures;
  a first S/D contact disposed over and physically contacting the S/D epitaxial feature over the first p-type semiconductor fin structure, the S/D epitaxial feature over the first n-type semiconductor fin structure, and the second dielectric fin; and
  a second S/D contact disposed over and physically contacting the S/D epitaxial feature over the second p-type semiconductor fin structure, the S/D epitaxial feature over the second n-type semiconductor fin structure, and the fourth dielectric fin.

9. The IC of claim 8, wherein each of the first and the second p-type semiconductor fin structures includes the same number of fins as each of the first and the second n-type semiconductor fin structures.

10. The IC of claim 8, wherein each of the first and the second p-type semiconductor fin structures includes one more fin than each of the first and the second n-type semiconductor fin structures.

11. The IC of claim 10, wherein each of the first and the second p-type semiconductor fin structures includes two fins and each of the first and the second n-type semiconductor fin structures consists of one fin, and wherein the S/D epitaxial feature disposed over each of the first and the second p-type semiconductor fin structures merges the two fins together.

12. The IC of claim 8, wherein the first S/D contact separates each sidewall of the second dielectric fin from the S/D epitaxial features over the first p-type and the first n-type semiconductor fin structures, and wherein the second S/D contact separates each sidewall of the fourth dielectric fin from the S/D epitaxial features over the second p-type and the second n-type semiconductor fin structures.

13. The IC of claim 8, wherein a top surface of each of the first, the second, the third, the fourth, and the fifth dielectric fins is below a widest portion of each S/D epitaxial feature.

14. The IC of claim 8, wherein a sidewall of each of the first, the second, the third, the fourth, and the fifth dielectric fins physically contacts a widest portion of each S/D epitaxial feature.

15. The IC of claim 8, wherein the SRAM cell is a first SRAM cell, the IC further comprising:
  a second SRAM cell disposed next to the first SRAM cell along the second direction, wherein layout of the second SRAM cell is a mirror image of layout of the first SRAM cell with respect to a first imaginary boundary line along the first direction;
  a third SRAM cell disposed next to the second SRAM cell along the first direction, wherein layout of the third SRAM cell is a mirror image of the layout of the second SRAM cell with respect to a second imaginary boundary line going through the fourth dielectric fin lengthwise; and
  a fourth SRAM cell disposed next to the third SRAM cell along the second direction and next to the first SRAM cell along the first direction, wherein layout of the fourth SRAM cell is a mirror image of the layout of the first SRAM cell with respect to the second imaginary boundary line.

16. An integrated circuit (IC), the IC comprising:
a first SRAM cell oriented lengthwise along a first direction and widthwise along a second direction generally perpendicular to the first direction, wherein the first SRAM cell includes:
  a first boundary fin, a first inner fin, a second inner fin, a third inner fin, and a second boundary dielectric fin disposed in this order along the first direction and oriented lengthwise along the second direction, wherein the first boundary, the first inner, the second inner, the third inner, and second boundary dielectric fins are disposed in isolation structures over a substrate;
  first and second p-type semiconductor fins disposed between the first boundary and the first inner dielectric fins;
  third and fourth p-type semiconductor fins disposed between the third inner and the second boundary dielectric fins;
  a first n-type semiconductor fin disposed between the first inner and the second inner dielectric fins,
  a second n-type semiconductor fin disposed between the second inner and the third inner dielectric fins,
  wherein the first and the second p-type semiconductor fins and the first and the second n-type semiconductor fins are oriented lengthwise along the second direction and separated from each of the first boundary, the first inner, the second inner, the third inner, and second boundary dielectric fins by portions of the isolation structures;
  first source/drain (S/D) epitaxial features each merging the first and the second p-type semiconductor fins and the third and the fourth p-type semiconductor fins, respectively;
  second S/D epitaxial features disposed over each of the first and the second n-type semiconductor fins;

a first S/D contact physically contacting with the first S/D epitaxial feature, the second S/D epitaxial feature, and the first inner dielectric fin; and a second S/D contact physically contacting with the first S/D epitaxial feature over the second p-type semiconductor fin structure, the second S/D epitaxial feature, and the third inner dielectric fin.

17. The IC of claim 16, wherein the first inner dielectric fin physically contacts each of the first and the second S/D epitaxial features, wherein the second inner dielectric fin physically contacts each of the second S/D epitaxial features, and wherein the third inner dielectric fin physically contacts each of the first and the second S/D epitaxial features.

18. The IC of claim 16, wherein each of the first, the second, and the third inner dielectric fins is physically separated from each of the first and the second S/D epitaxial features.

19. The IC of claim 18, wherein a top surface of each of the first, the second, and the third inner dielectric fins is lower than a widest portion of each of the first and the second S/D epitaxial features.

20. The IC of claim 16, further comprising gate structures engaged with some of the first boundary, the first inner, the second inner, the third inner, and second boundary dielectric fins, wherein the dielectric fins not engaged with the gate structures are lower than the dielectric fins engaged with the gate structures.

* * * * *